(12) United States Patent
Stein et al.

(10) Patent No.: US 7,164,158 B2
(45) Date of Patent: Jan. 16, 2007

(54) ELECTRICAL CONTACT FOR OPTOELECTRONIC SEMICONDUCTOR CHIP AND METHOD FOR ITS PRODUCTION

(75) Inventors: Wilhelm Stein, Liudau (DE); Michael Fehrer, Bad Abbach (DE); Johannes Baur, Laaber (DE); Matthias Winter, Regensburg (DE); Andreas Ploessl, Regensburg (DE); Stephan Kaiser, Regensburg (DE); Berthold Hahn, Hemau (DE); Franz Eberhard, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/789,199

(22) Filed: Feb. 26, 2004

(65) Prior Publication Data

US 2004/0256632 A1    Dec. 23, 2004

(30) Foreign Application Priority Data

Feb. 26, 2003  (DE) .............................. 103 08 325
Oct. 30, 2003  (DE) .............................. 103 50 707

(51) Int. Cl.
*H01L 33/00*    (2006.01)

(52) U.S. Cl. .................... 257/99; 257/98; 257/433; 257/734; 257/758; 257/779

(58) Field of Classification Search ............... 257/81, 257/82, 432, 433, 723, 724, 777
See application file for complete search history.

(56) References Cited

U.S. PATENT DOCUMENTS

| | | | | |
|---|---|---|---|---|
| 4,210,389 A | * | 7/1980 | Burkhart et al. | ............ 359/896 |
| 6,228,456 B1 | * | 5/2001 | Butterbach et al. | ........ 428/64.1 |
| 6,291,840 B1 | | 9/2001 | Uemura et al. | |
| 6,791,119 B1 | * | 9/2004 | Slater et al. | .................. 257/99 |
| 6,806,544 B1 | * | 10/2004 | Liu | ............................. 257/414 |
| 2003/0107137 A1 | * | 6/2003 | Stierman et al. | ............ 257/763 |

FOREIGN PATENT DOCUMENTS

| | | |
|---|---|---|
| DE | 199 21 987 A1 | 11/1999 |
| EP | 0 926 744 A2 | 12/1998 |
| EP | 1 168 460 A2 | 6/2001 |
| EP | 1 179 836 A2 | 8/2001 |
| JP | 11220171 A | 8/1999 |
| WO | WO 01/47039 A1 | 6/2001 |
| WO | WO 02/19493 A1 | 3/2002 |

* cited by examiner

*Primary Examiner*—Wai-Sing Louie
(74) *Attorney, Agent, or Firm*—Cohen Pontani Lieberman & Pavane LLP

(57) ABSTRACT

An electrical contact for an optoelectronic device which includes a mirror layer (2) of a metal or a metal alloy, a protective layer (3), which serves for reducing the corrosion of the mirror layer (2), a barrier layer (4), a coupling layer (5), and a solder layer (8). A contact of this type is distinguished by high reflectivity, good ohmic contact with respect to the semiconductor, good adhesion on the semiconductor and good adhesion of the layers forming the contact with one another, good thermal stability, high stability with respect to environmental influences, and also solderability and patternability.

25 Claims, 2 Drawing Sheets

ELECTRICAL CONTACT FOR OPTOELECTRONIC SEMICONDUCTOR CHIP AND METHOD FOR ITS PRODUCTION

RELATED APPLICATIONS

This patent application claims the priority of the German patent applications 10308325.1 filed Feb. 26, 2003 and 10350707.8 filed Oct. 30, 2003, the disclosure of which is hereby incorporated by reference.

FIELD OF THE INVENTION

The invention relates to an electrical contact for an optoelectronic semiconductor chip and to a method for its production.

BACKGROUND OF THE INVENTION

In modern production methods for light-emitting diodes (LEDs), the light-emitting layer sequence is often first grown on a growth substrate, subsequently applied to a new carrier, and then the growth substrate is detached. This method has on the one hand the advantage that growth substrates, in particular growth substrates suitable for the production of nitride compound semiconductors, which are comparatively expensive, can be reused. Such a device is known for example from U.S. patent application Ser. No. 10/377,363. This method, referred to as thin-film technology, also has the advantage that the detachment of the original substrate allows the disadvantages of the latter, such as for example a low electrical conductivity and increased absorption of the radiation generated or detected by the optoelectronic device, to be avoided. As a result, the efficiency of LEDs, in particular the brightness, can be increased.

A further technology for the production of highly efficient LEDs is so-called flip-chip technology. Such a device is disclosed for example in U.S. Pat. No. 6,514,782. Described therein is a radiation-emitting semiconductor chip which is connected to a carrier substrate both by the n contact and by the p contact by means of a direct soldered connection.

Both in thin-film technology and in flip-chip technology, it is advantageous to form the contact between the semiconductor chip and the carrier substrate as a reflecting contact. In this way, penetration of the radiation generated or detected by an optoelectronic device into the contact is avoided and consequently the absorption losses are reduced.

Such a reflecting electrical contact is disclosed for example in U.S. Pat. No. 6,194,743. In this document, a silver layer is specified as a suitable ohmic contact for a p-type GaN semiconductor. However, mention is also made of the low adhesive strength and corrosion resistance of silver layers on nitride compound semiconductors.

SUMMARY OF THE INVENTION

One object of the invention is to provide an improved electrical contact.

Another object of the invention is to provide an electrical contact having high reflectivity, good ohmic contact with respect to a semiconductor, good adhesion on the semiconductor and good adhesion of the layers forming the contact with one another, good thermal stability, high stability with respect to environmental influences, and also solderability and patternability.

A further object of the invention is to provide a method for producing such a contact.

This and other objects are attained in accordance with one aspect of the present invention directed to an electrical contact of an optoelectronic semiconductor chip, comprising a mirror layer, comprised of a metal or a metal alloy adapted to be formed over the semiconductor chip, a protective layer over said mirror, a layer sequence of a barrier layer and a coupling layer over said protective layer, and a solder layer over said layer sequence.

Another object of the invention is directed to a method for producing an electrical contact of an optoelectronic semiconductor chip, comprising providing a mirror layer, comprised of a metal or metal alloy, over the semiconductor chip, providing a protective layer over said mirror layer, providing a layer sequence of a barrier layer and a coupling layer over said protective layer, and providing a solder layer over said layer sequence.

DETAILED DESCRIPTION OF THE DRAWINGS

Figure 1:
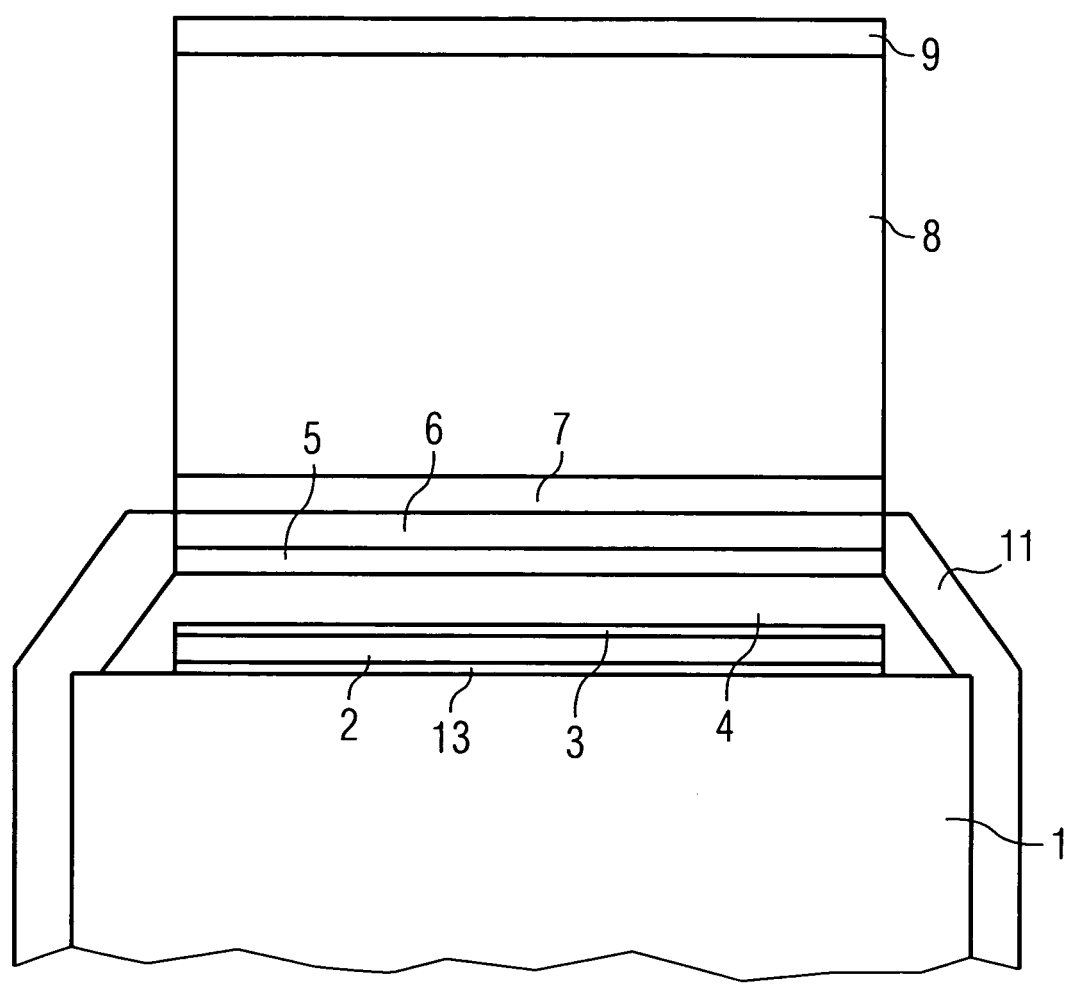
FIG. 1 shows a schematic cross section through an embodiment of an electrical contact according to the invention and FIG. 2A–2E show schematically represented intermediate stages to explain the patterning by means of the lift-off technique.

FIG. 1 shows a semiconductor chip 1, to which an embodiment of an electrical contact according to the invention has been applied. The semiconductor chip may have on its surface, for example, a material from the group of nitride compound semiconductors, a nitride compound semiconductor being understood as meaning a nitride compound of elements of the third and/or fifth main group, in particular GaN, AlGaN, InGaN, AlInGaN, AlN or InN.

A mirror layer 2 has been applied to the semiconductor chip 1. The mirror layer contains a metal or a metal alloy, preferably one of the following metals: silver, aluminum or platinum. The mirror layer 2 is preferably between 70 nm and 130 nm thick. The mirror layer 2 reflects the radiation that is incident from the direction of the optoelectronic semiconductor chip 1 and thereby prevents the absorption of this radiation in the electrical contact. Apart from this advantageous optical property, the mirror layer also establishes an ohmic contact with respect to the semiconductor. For example, a Pt/Al combination may be used for establishing an ohmic contact on an InGaN semiconductor. On p-GaN semiconductor material, a silver layer is suitable for establishing an ohmic contact.

Furthermore, a protective layer 3 has been applied to the mirror layer 2, in order to protect it from corrosion in further process steps. The protective layer 3 is preferably a titanium or platinum layer between 5 nm and 15 nm thick. In the case of wet-chemical patterning of the mirror layer 2, titanium is preferably used as the material for the protective layer 3, since the etching of platinum is technically very difficult.

An improvement of the adhesion of the mirror layer 2 on the semiconductor chip 1 can be achieved by an annealing step. For example, a mirror layer 2 of silver is annealed for approximately 5 minutes at 300° C. In the case of wet-chemical patterning of the mirror layer 2, this annealing step can be carried out directly after the coating.

A further possibility for improving the adhesion of the mirror layer 2 is to apply a layer 13 of an electrically conductive material between 0.1 nm and 0.5 nm thin to the semiconductor chip 1 before the application of the mirror layer 2. This thin layer 13 may be deposited over the surface area or in the form of islands. The thin layer 13 preferably contains Pt, Pd or Ni. It is particularly advantageous to use these materials on a surface of a semiconductor chip 1 having a nitride compound semiconductor material and when a mirror layer 2 which contains Ag or Al is used.

A barrier layer 4 has been applied to the protective layer 3. The barrier layer 4 preferably contains TiW(N) and is approximately 300 nm to 500 nm thick. By patterning the barrier layer 4 by means of the lift-off technique, which is described in still more detail below, a complete coverage of the mirror layer 2 and of the protective layer 3 with the barrier layer 4 can be achieved. The patterning of the following layers can also take place by means of this lift-off technique. One advantage of this type of patterning is the low thermal loading of the system of layers.

A coupling layer 5, which ensures good adhesion of the layers that follow, has been applied to the barrier layer 4. The coupling layer 5 is preferably a titanium layer between 30 nm and 70 nm thick. It should be understood that the position of the coupling layer and the barrier layer in the layer sequence may be interchanged.

A wetting layer 6, which brings about uniform wetting of the contact area with the solder during the later soldering operation, has preferably been applied to said coupling layer. The wetting layer 6 is preferably a platinum layer between 70 nm and 130 nm thick.

A solder layer 8, which may be either a hard solder, such as for example AuSn, or a soft solder, such as for example Sn, has been applied to the wetting layer 6. The solder layer 8 has been applied for example by means of the PVD technique or by means of electro-deposition. Patterning of the solder layer 8 is possible by means of the lift-off technique described above or by means of wet-chemical patterning.

The solder layer 8 may optionally be covered with a gold layer 9, which is preferably between 30 nm and 70 nm thick.

Advantageously inserted between the wetting layer 6 and the solder layer 8 is a gold layer 7, which protects the system of layers lying under it from corrosion before the application of the solder layer 8. This is advisable in particular whenever a mask layer applied for the patterning of the system of layers produced up to this time is removed before the application of the solder layer. The preferred thickness of such a gold layer 7 when an Sn solder is used is approximately 70–130 nm, when an AuSn solder is used approximately 400 nm to 800 nm. The function of the wetting layer 6 is retained in spite of this intermediate layer, since the gold layer 7 melts during the later soldering operation.

In the soldering operation it is possible, but undesired, for the solder to reach the side flanks of the semiconductor chip. In order in this case to prevent a short-circuit of the solder with the semiconductor layers ending at the side flanks of the semiconductor chip, the side flanks may be provided with a passivation 11, for example of silicon dioxide or silicon nitride.

A contact of this type is suitable in particular for use in flip-chip technology and thin-film technology. A thin-film semiconductor body is to be understood for the purposes of the invention as meaning a semiconductor body which is epitaxially grown on an epitaxial substrate and from which the epitaxial substrate has been detached.

The thin-film semiconductor body is for example connected by the electrical contact to a carrier body (not shown, but which would be located above the solder layer). The materials of the solder layer 8 and of the carrier body are preferably made to match each other in such a way that they can form an alloy, in particular a eutectic alloy, that is to say no metallurgical barrier exists between the solder layer 8 and the carrier body. The material of the carrier body can begin to melt during the soldering operation and consequently serve as a material reservoir for the forming of a eutectic alloy. Furthermore, incipient melting of the carrier body at the soldering location may advantageously have the effect that any particles possibly occurring during the soldering operation can melt into the carrier. As a result, the intercalation of particles between the carrier body and the semiconductor chip 1, which could increase the distance between the carrier and the semiconductor chip, is reduced. The forming of voids is also likewise reduced.

The combination of a solder layer 8 of AuGe with a Ge carrier or the combination of an AuSi solder layer 8 with a Si carrier is particularly advantageous. A Ge carrier is suitable in particular for the production of thin-film LEDs, in the case of which a growth substrate of sapphire is detached by means of a laser lift-off method, since germanium has a similar coefficient of expansion to sapphire and therefore mechanical stresses are reduced by the heat produced in the detachment process.

The eutectic temperatures which have to be achieved or exceeded in the soldering operation are for AuGe approximately 361° C. and for AuSi approximately 363° C. When such solders are used, the system of layers of the contact must be stable at the soldering temperature. On account of the required thermal stability, the thin layer 13 which is inserted between the semiconductor chip 1 and the mirror layer 2 to improve the adhesion of the mirror layer 2 preferably contains palladium or a nickel oxide. A contact with a thin layer 13 of one of these materials is also relatively insensitive to hydrogen-containing contaminants, which may be integrated into the system of layers during the epitaxy.

Suitable for example for the patterning of an electrical contact according to the invention are known methods of wet-chemical patterning, which are not to be explained in any more detail here. The so-called lift-off technique (lift-off method) is preferably used for the invention. The method steps in the lift-off technique are explained in more detail below by way of example on the basis of the patterning of the mirror layer 2 in conjunction with FIGS. 2a to 2e.

Figure 2A:
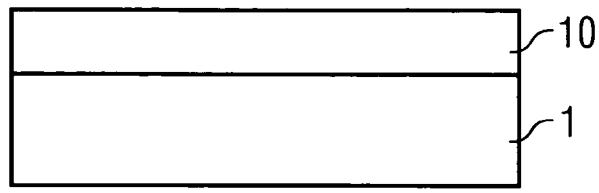

As represented in FIG. 2a, a mask layer 10 of a photoresist is first applied to the semiconductor chip 1.

Figure 2B:
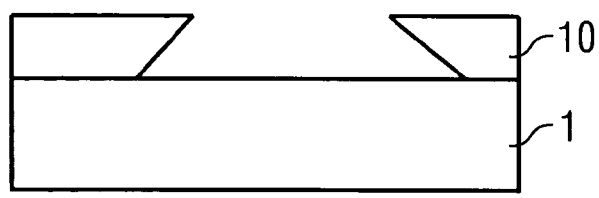

By means of suitable exposure, developing and etching, a window is produced in the mask layer 10, having a strong undercut as represented in FIG. 2b. The undercut may be formed for example by underetching with a suitable etchant. As a result, the mask layer has a narrower cross section on the side remote from the semiconductor chip than on the surface of the semiconductor chip. The flanks of the mask layer facing the window preferably form an angle of less than 75° with the surface of the semiconductor chip 1. Since the conditions for producing such a window are known to a person skilled in the art, they are not explained in any more detail at this point.

Figure 2C:
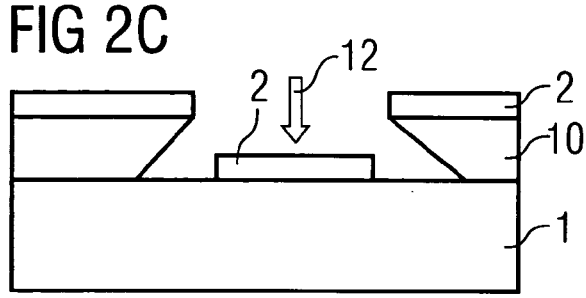

Subsequently, the mirror layer 2 is applied to the semiconductor chip by a directed coating technique, for example by vapor deposition. The depositing of the mirror layer 2 takes place substantially only onto the region of the semiconductor chip 1 that is not shadowed by the mask layer 10 in the vapor-depositing direction 12, while the regions of the semiconductor chip 1 lying under the undercut of the window are shadowed and, as represented in FIG. 2c, are not covered by the mirror layer 2. In the same way, further layers, for example a protective layer 3 for the mirror layer 2, can then be applied to the semiconductor chip 1 (not represented).

Figure 2D:
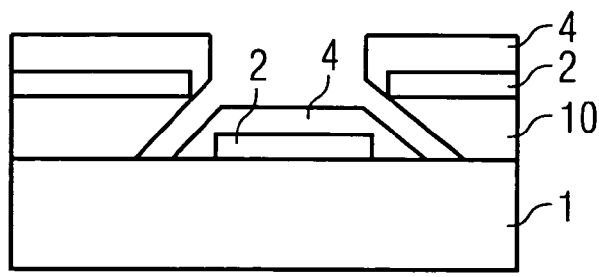

In the process step which follows, a further layer, which may for example be a barrier layer 4, is applied to the semiconductor chip 1, as represented in FIG. 2d, by an undirected coating method, for example by means of sputtering. The use of an undirected coating method has the effect that the regions of the semiconductor chip 1 lying under the undercut of the window are also covered with the applied layer, and consequently complete coverage of the previously applied layer or layers, for example of the mirror layer 2, is achieved.

Figure 2E:
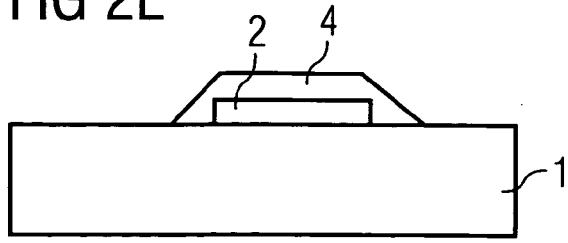

After the detachment of the mask layer 10, the semiconductor chip 1 is covered with a patterned layer, for example the mirror layer 2, and a further layer, covering this layer, for example the barrier layer 4, as shown in FIG. 2e.

A lift-off technique is generally to be understood for the purposes of the invention as meaning the application or formation of a mask layer, the application of one or more layers and subsequent detachment of the mask layer. The mask layer is preferably provided with an undercut, a first layer is deposited in a directed manner, and a second layer is deposited in an undirected manner for the complete coverage of the first layer, complete coverage being understood as meaning covering of the surface and the side flanks.

The extent of protection of the invention is not restricted by the description of the invention on the basis of the exemplary embodiments. Rather, the invention comprises every novel feature and every combination of features, which in particular includes every combination of features in the patent claims, even when this combination is not explicitly specified in the patent claims.

The invention claimed is:

1. An electrical contact of an optoelectronic semiconductor chip (1), comprising:
    a mirror layer (2) comprised of a metal or a metal alloy adapted to be formed over the semiconductor chip;
    a protective layer (3) over said mirror layer (2);
    a layer sequence of a barrier layer (4) and a coupling layer (5) over said protective layer; and
    a solder layer (8) over said layer sequence;
    wherein said mirror layer, protective layer, layer sequence and solder layer are all electrically conductive so that current can flow through the electrical contact to and from the semiconductor chip.

2. The electrical contact as claimed in claim 1, which includes a wetting layer (6) between the coupling layer (5) and the solder layer (8).

3. The electrical contact as claimed in claim 1, which is applied to a surface of a semiconductor chip (1) having a nitride compound semiconductor material.

4. The electrical contact as claimed in claim 1, in which the mirror layer (2) contains silver, aluminum or platinum.

5. The electrical contact as claimed in claim 1, in which the mirror layer (2) is between 70 nm and 130 nm thick.

6. The electrical contact as claimed in claim 1, in which a layer (13) of an electrically conductive material between 0.1 and 0.5 nm thin is included between the semiconductor chip (1) and the mirror layer (2) to improve the adhesion of the mirror layer (2).

7. The electrical contact as claimed in claim 6, in which the surface of the semiconductor chip (1) has a nitride compound semiconductor material, the mirror layer (2) contains Al or Ag, and the thin layer (13) contains Pt, Pd or Ni.

8. The electrical contact as claimed in claim 1, in which the protective layer (3) contains titanium or platinum.

9. The electrical contact as claimed in claim 1, in which the protective layer (3) is between 5 nm and 15 nm thick.

10. The electrical contact as claimed in claim 1, in which the barrier layer (4) completely covers the mirror layer (2) and the protective layer (3).

11. The electrical contact as claimed in claim 1, in which the barrier layer (4) contains TiW(N).

12. The electrical contact as claimed in claim 1, in which the barrier layer (4) is between 300 nm and 500 nm thick.

13. The electrical contact as claimed in claim 1, in which the coupling layer (5) contains titanium.

14. The electrical contact as claimed in claim 1, in which the coupling layer (5) is between 30 nm and 70 nm thick.

15. The electrical contact as claimed in claim 2, in which the wetting layer (6) contains platinum.

16. The electrical contact as claimed in claim 2, in which the wetting layer (6) is between 70 nm and 130 nm thick.

17. The electrical contact as claimed in claim 2, in which a gold layer (7) is applied to the wetting layer (6).

18. The electrical contact as claimed in claim 1, in which a gold layer (9) is applied to the solder layer (8).

19. The electrical contact as claimed in claim 18, in which the gold layer (9) applied to the solder layer (8) is approximately 30 rim to 70 nm thick.

20. The electrical contact as claimed in claim 1, which is adapted for connection of the semiconductor chip (1) to a carrier body, the material of the solder layer (8) being suitable for forming an alloy with the material of the carrier body.

21. The electrical contact as claimed in claim 20, in which the solder layer (8) contains AuGe and the carrier body contains Ge.

22. The electrical contact as claimed in claim 20, in which the solder layer (8) contains AuSi and the carrier body contains Si.

23. The electrical contact as claimed in claim 6 which is adapted for connection of the semiconductor chip (1) to a carrier body, the material of the solder layer (8) being suitable for forming an alloy with the material of the carrier body, and wherein said thin layer (13) comprises palladium or a nickel oxide.

24. The electrical contact as claimed in claim 1, wherein said layer sequence comprises said barrier layer over said protective layer, and said coupling layer over said barrier layer.

25. The electrical contact as claimed in claim 20, wherein said alloy is a eutectic alloy.

* * * * *